United States Patent [19]

Narod

[11] Patent Number: 4,914,381
[45] Date of Patent: Apr. 3, 1990

[54] DIRECT-COUPLED FLUXGATE CURRENT SENSOR

[75] Inventor: Barry Narod, Vancouver, Canada

[73] Assignee: Barrigar & Oyen, Vancouver, Canada

[21] Appl. No.: 234,206

[22] Filed: Aug. 19, 1988

Related U.S. Application Data

[63] Continuation-in-part of Ser. No. 55,434, May 28, 1987, abandoned.

[51] Int. Cl.[4] .......................... G01R 33/02; F02P 1/00
[52] U.S. Cl. ................................. 324/117 R; 324/253; 336/214
[58] Field of Search .................... 324/127, 117 R, 253, 324/254; 336/65, 90, 92, 173, 174, 175, 176, 212, 214; 33/355 R, 357, 361; 174/DIG. 10

[56] References Cited

U.S. PATENT DOCUMENTS

| | | | |
|---|---|---|---|
| 2,382,199 | 8/1945 | Brink | 175/358 |
| 2,760,158 | 8/1956 | Kerns | 324/99 |
| 3,436,650 | 4/1969 | Hinton | 324/43 |
| 3,808,508 | 4/1974 | Ford | 324/254 |
| 4,293,815 | 10/1981 | West et al. | 324/254 |
| 4,324,255 | 4/1982 | Barach et al. | 128/630 |
| 4,523,147 | 6/1985 | D'Angelo et al. | 324/248 |
| 4,564,812 | 1/1986 | Van Dijk | 324/309 |
| 4,658,799 | 4/1987 | Kusaka et al. | 336/214 |

FOREIGN PATENT DOCUMENTS 763576 7/1967 Canada .................. 324/40

OTHER PUBLICATIONS

"Steady-State Characteristics of the Capacitively Loaded Flux Gate Sensor", B. Barry Narod and R. Doncaster Russell, IEEE Transactions on Magnetics, vol. MAG-20, No. 4, Jul. 1984.

"Characteristics of the Capacitively Loaded Flux Gate Sensor", R. Doncaster Russell, B. Barry Narod and Frank Kollar, IEEE Transactions on Magnetics, Vol. MAG-19, No. 2, Mar. 1983.

Primary Examiner—Reinhard J. Eisenzopf
Assistant Examiner—Vinh P. Nguyen
Attorney, Agent, or Firm—Christie, Parker & Hale

[57] ABSTRACT

A direct-coupled fluxgate current sensor which is driven to hard saturation to achieve a sudden change in magnetic properties of the sensor, has: (a) a first closed loop core of ferromagnetic material encased in a sleeve wound with a first toroidal drive winding, the winding for the first core extending around the circumference of the first core; (b) a second closed loop core of ferromagnetic material encased in a sleeve wound with a second toroidal drive winding independent of the first winding, the winding for the second core extending around the circumference of the second core; and, (c) a closed loop core casing which is adapted to cooperate with the first core and the second core, the closed loop core casing and the first and second core being wound as a unit with a toroidal sense winding independent of the first and second toroidal drive windings, the winding for the closed loop core casing extending around the circumference of the closed loop core casing.

19 Claims, 7 Drawing Sheets

DIRECT-COUPLED FLUXGATE CURRENT SENSOR

This is a continuation-in-part of application Ser. No. 055,434, filed May 28, 1987, now abandoned.

FIELD OF THE INVENTION

This invention is directed to a novel fluxgate current sensor which is useful in sensing toroidal magnetic fields. More particularly, this invention pertains to a single fluxgate sensor, configured into a toroid, which can sense toroidal magnetic fields at very low levels.

BACKGROUND OF THE INVENTION

Devices and methods employed for direct-coupled sensing of electrical currents conventionally employ either Hall-effect devices in conjunction with flux-concentrators, or a collection of small linear fluxgates strung in series around the conductor.

Such devices have two principal disadvantages. First, the devices are not as sensitive as one might want them to be and thus are not suitable for certain uses. Secondly, such devices suffer from the disadvantage that as the size of the device is increased, a proportional deterioration of performance in the device is experienced.

The following reference disclose subject matter which is more or less pertinent to this field of technology.

| U.S. Pat. No. | Inventor |
|---|---|
| 2,382,199 | Brink |
| 2,760,158 | Kerns |
| 3,436,650 | Hinton |
| 4,293,815 | West el al |
| 4,324,255 | Barach et al |
| 4,523,147 | D' Angelo et al |
| 4,564,812 | Van Dijk |
| Canadian Patent No. 763,576 | Punnett |

Punnet discloses a device that is commonly known as a magnetic amplifier current sensor. Punnet's magnetic amplifier has a superficial physical resemblance to a fluxgate current sensor. Punnett's magnetic amplifier includes a first and second closed loop core means, each being wound with independent toroidal windings. An independent toroidal sense winding encloses both cores. At page 7, lines 16 and 17, Punnett states that with his arrangement "current in the range of 1 milliamp to 100 amps can be measured". He does not therefore disclose that his magnetic amplifier is capable of sensing currents in the region of 100 nanoamperes.

In a magnetic amplifier, it is desirable that the differential permeability of the magnetic circuit vary slowly and smoothly with the applied field (H), according to a process called partial saturation. Desirable materials are those which has "S"-shaped magnetization curves.

Partial saturation may be defined as any reduction of differential permeability with applied field. Full saturation, which is the condition best suited for fluxgates, is the reduction of differential permeability to that of free space. Magnetic amplifiers work best at low field levels, i.e. in the range of partial saturation. They count on the differential permeability varying smoothly in order to have the sensor operate reasonably linearly over its dynamic range. It is essential that neither the drive field nor the field due to the measured current drive the cores into hard saturation. For example, if the measured current by itself hard-saturated the cores then the drive fields could produce no imbalanced fields to be detected by the sense winding. If the drive field approaches hard saturation, then the magnetic amplification process becomes non-linear, and the sensor cannot be used in an open-loop configuration as described in Punnet.

Punnet does not disclose the technique of hard saturating his cores. This is evident from page 6, cores becoming magnetized and the technique of applying a 50% increase in magnetizing current in the primary windings to demagnetize the cores.

On Punnett's experimental model, page 7, lines 3 to 17, the field level of the drive was 55 amps per metal (A/M) and the model at 100 amps was measuring a field of 91 A/M. Since 91 A/M could not be saturating the cores of the magnetic material, for reasons given above, it follows that the 55 A/M drive field would also not hard saturate the core materials.

Kerns discloses a method and apparatus for measuring electrical current. Three ferro magnetic toroidal cores are disposed in parallel relation with the transverse axis of each in alignment. The windings are connected in series opposition so that a magnetic field established in the respective cores by a current flowing through the windings is opposing. However, the device disclosed by Kerns is not a fluxgate. The Kerns device is commonly referred to as a magnetic amplifier. Kerns uses the two toroidal cores for a different purpose than the subject invention. The two cores are not driven into saturation as is the case with the subject fluxgate sensor. This is demonstrated by the passage at column 4, line 35 "the magnetic flux never reaches the saturation point of the magnetic material employed in the cores". Also, Kerns does not employ a third sensor winding to detect second harmonic content of the flux in the cores.

Hinton discloses a current sensor but it is not a fluxgate. Hinton does not use ferromagnetic modulation of induction to achieve sensitivity. The magnetometer equivalent is called the "spinning coil magnetometer" and moving parts in such sensors are fundamental to their operation. The subject current sensor has no moving parts.

Barach discloses a current sensor but it also is not a fluxgate. It is not direct coupled and operates on the principle of a superconducting magnetometer (SQUID).

D'Angelo et al. do not disclose a current sensor nor a fluxgate. The device disclosed by D'Angelo et al. Operates on the principle of the superconducting magnetometer (SQUID).

Finally, Van Dijk does not disclose either a current sensor or a fluxgate. The Van Dijk device operates on the principle of nuclear magnetic resonance which in this case is an active sensor.

SUMMARY OF THE INVENTION

The invention pertains to a novel directcoupled fluxgate current sensor which is driven to hard saturation to achieve a sudden change in magnetic properties of the sensor, comprising: (a) a first closed loop core means of ferromagnetic material encased in a sleeve wound with a first toroidal drive winding, the winding for said first core means extending around the circumference of the first core means; (b) a second closed loop core means of ferro-magnetic material encased in a sleeve wound with a second toroidal drive winding independent of the first winding, the winding for said second core means extending around the circumference of the second core means; and, (c) a closed loop core casing means which is adapted to cooperate with the first closed loop core means and the second closed loop core means, the closed loop core casing means and the first and second core means being wound as a unit around its circumference with a toroidal sense winding independent of the first and second toroidal drive windings.

In the fluxgate current sensor, the closed loop core casing means may have any number of suitable shapes, but two preferred shapes are an "O-shape" and an "H-shape" cross section. The first and second ring core means may have any number of suitable shapes. For the "O-shape" and "H-shape" casing means the core means may have a circular or rectangular cross sectional area respectively, and may be adapted to be received in the "O-shaped" casing or the openings of the "H-shaped" cross sectioned shaped ring core casing means.

The cores can be constructed of high performance magnetic materials such as nickel ferromagnetic alloy or amorphous ferromagnetic alloy.

The invention also pertains to a method of sensing toroidal magnetic fields utilizing a single direct-coupled fluxgate current sensor wherein two closed loop cores with windings around their respective circumferences are used as the modulating element of the fluxgate and the two closed loop cores cooperate with a closed loop core casing shaped in the form of a toroid, the closed loop core casing having a toroidal sense winding wound completely around the exterior of the casing. The two closed loop cores must be arranged side by side. Further, the two closed loop cores are driven in opposition to one another. The cores are magnetically saturated by high levels of electric current to eliminate memory, which is present reduces the performance level of the sensor.

DRAWINGS

In the drawings which disclose a specific embodiment of the invention and are not to be construed as limiting the scope of the invention in any way:

DETAILED DESCRIPTION OF A SPECIFIC EMBODIMENT OF THE INVENTION

Figure 1:
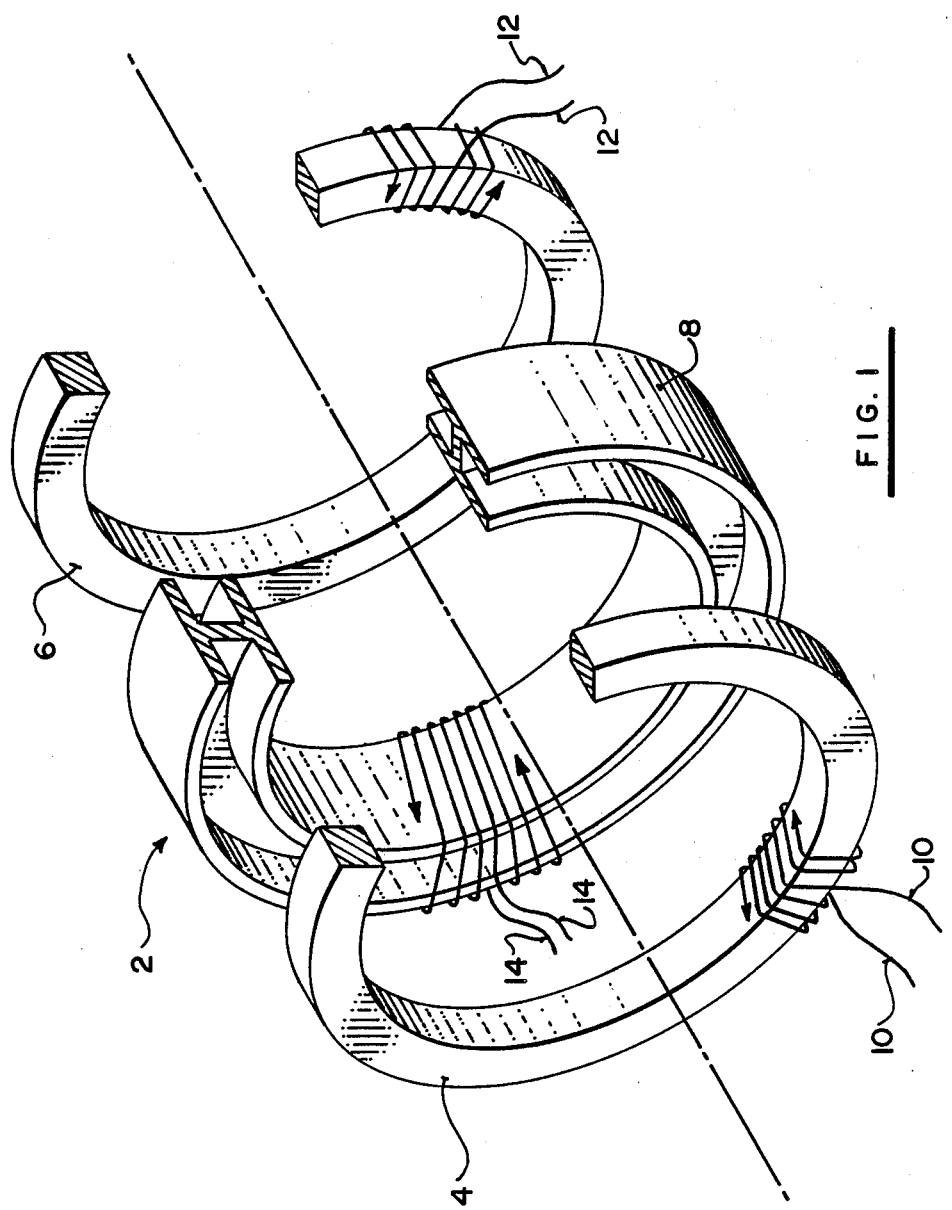
FIG. 1 illustrates a perspective, exploded partially sectional view of one embodiment of the direct-coupled fluxgate current sensor.

Fluxgates work best in the region of full saturation. They count on their being a large, discrete change in the flux in the magnetic circuits, between the two phases of the fluxgate cycle which may be called the hard saturated phase and the unsaturated phase. Fluxgates work best with magnetic materials having square magnetization curves, with high intrinsic permeability. It is desirable that the magnetic material have a constant differential permeability at any field level less than hard saturation. The sensor works best by achieving a sudden switch from the unsaturated state to the hard saturated state. When this transition occurs, Faraday's law requires that flux due to the measured current and residing in the magnetic material be gated to the sense winding (hence the name fluxgate).

Fluxgates function best when the drive fields are much larger than field levels required to hard saturate the magnetic material in the magnetic circuits, and when the measured field is much smaller than the hard saturating field. Drive field levels typically exceed hard saturation levels by about a hundred times while operating field levels are typically about one thousand times smaller than hard saturation field levels. Typically, fluxgates produce output power levels that are hundreds or thousands of times larger than those from magnetic amplifiers, for a given measured field level, for otherwise comparable sensors. Fluxgates work best when there exist well-determined times at which the flux in the magnetic circuits, and the current in the sense winding change.

One of the attributes of ring-core fluxgates is that they have no memory effect. The magnetic material is saturated sufficiently hard on every cycle that there is no magnetic record in the core material from any previous magnetization cycle. Thus there is no need for demagnetization cycles. Hard saturation circuitry for fluxgates is most easily implemented for ring-core sensors, as opposed to open-magnetic-circuit parallel strip sensors, the latter requiring in some cases demagnetization methods.

The direct-coupled fluxgate current sensor of the invention has an important advantage over existing sensors in that it uses a single fluxgate sensor, configured into a toroid, to sense toroidal magnetic fields and can sense currents as low as 100 nano-amperes. The subject sensor can be used to detect electrical currents in situ since electrical currents give rise to toroidal magnetic fields.

The aperture of the sensor toroid defines the area in which electrical currents are detected. Since the sensor need not be in physical contact with the current-carrying medium, any electrically conducting environment is appropriate for utilization of the sensor of the invention. Thus the subject sensor is equally viable for use in fluids (liquids or gases) or around solid conductors.

The features of the fluxgate current sensor which are believed to be unique and novel are the use of closed loop cores of ferromagnetic material as the modulating element of the fluxgate, and the use of a complete toroidal sense winding on the toroid. The cores are magnetically saturated so that any memory which would interfere with the sensitivity of the sensor is eliminated. Together these factors result in providing optimum sensitivity to toroidal fields and minimum crosstalk with poloidal fields. The use of two closed loop cores, side-by-side, but driven in opposition, combines the advantages of both parallel-strip fluxgates and ring-core fluxgates.

Figure 2:
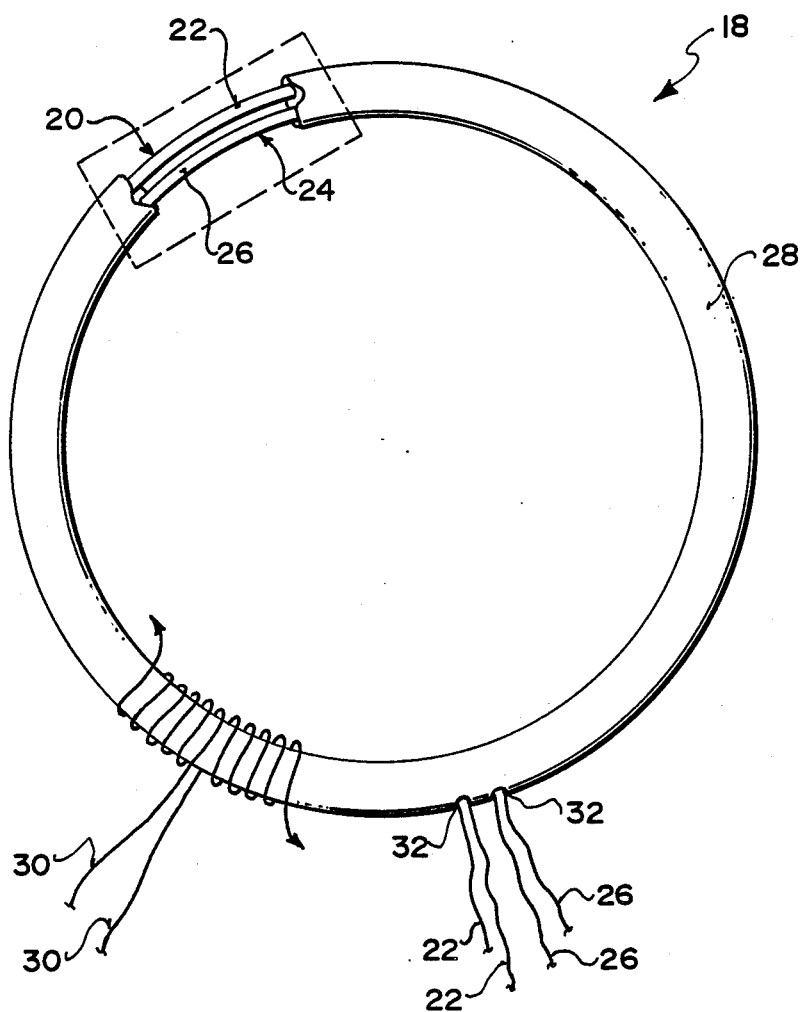
FIG. 2 illustrates a front view of an alternative embodiment of the direct coupled fluxgate current sensor.
Figure 3:
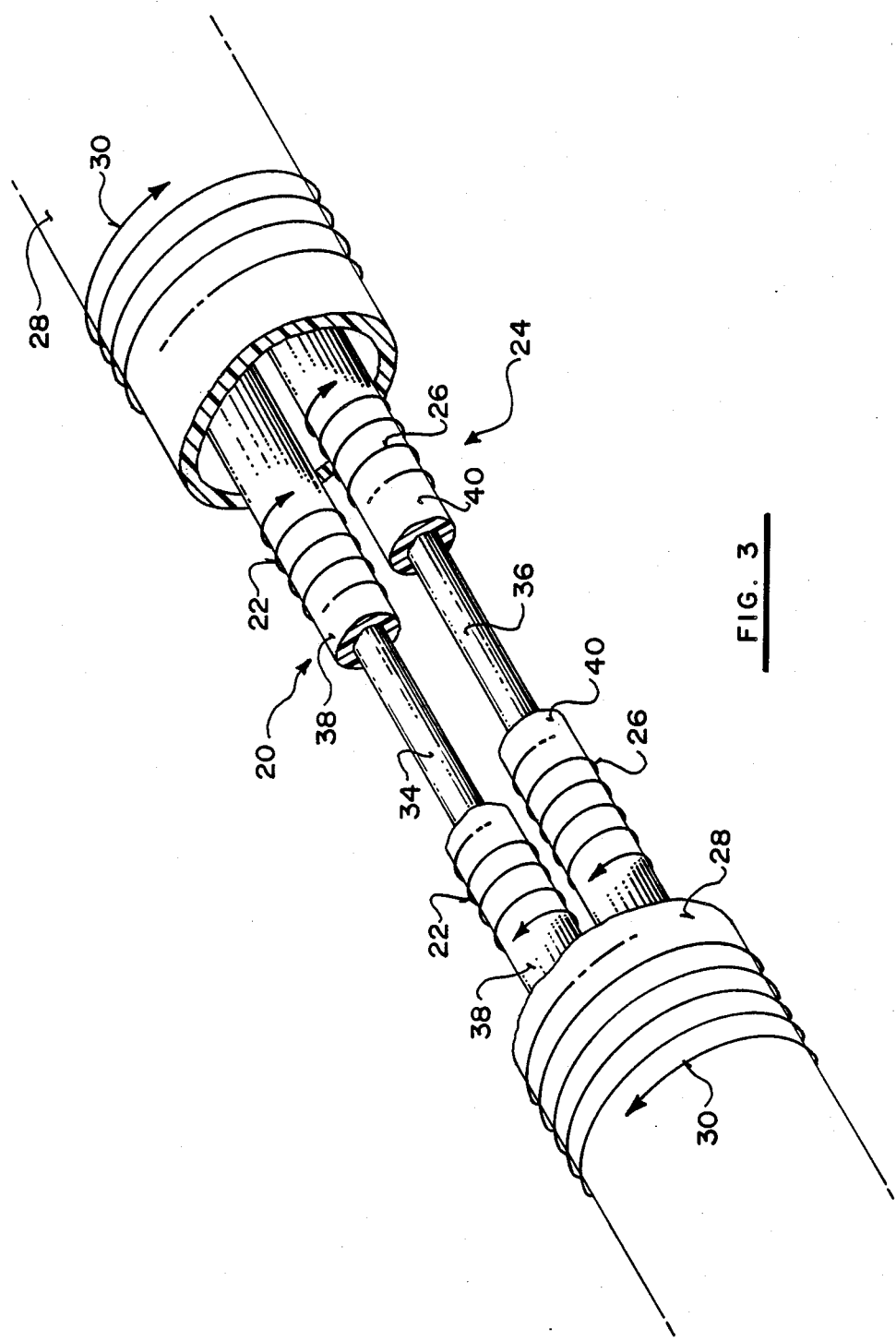
FIG. 3 illustrates a detailed perspective partially sectioned view of the sensor illustrated in FIG. 2.

To assist in understanding the concept, operation and construction of the invention, there follows a detailed discussion which refers to two alternative specific embodiments as depicted in FIGS. 1, 2 and 3 of the drawing. FIG. 1 illustrates an exploded perspective partial section view of the components making up the direct-coupled fluxgate current sensor. As can be seen in FIG. 1, the direct-coupled fluxgate current sensor 2 is constructed of three principal parts, namely, a first closed loop core 4, a second closed loop core 6, and a closed loop core casing 8. The closed loop core casing 8 has an "H-shaped" cross section, which enables the first closed loop core 4 and the second closed loop core 6 to fit within the openings formed by the "H" configuration. The closed loop core casing 8 also serves to provide a form for the toroidal sense winding.

In assembling the sensor 2, the exterior of closed loop core 4 is wound throughout its circumference by a first toroidal drive winding 10. The second closed loop core 6 is also wound independently throughout its circumference by a second toroidal drive winding 12. The first closed loop core 4 and the second closed loop core 6 are then placed in position in the respective openings formed by the "H-shape" of closed loop core casing 8. The ring core casing 8 is then wound over its entire circumference by toroidal sense winding 14.

The sensor functions when currents flowing in the toroidal drive windings 10 and 12 are used to modulate the inductance of the toroidal sense winding 14 by magnetically saturating closed loop cores 4 and 6. The currents in the toroidal drive windings 10 and 12 are arranged so that the magnetic fields produced in closed loop cores 4 and 6 are in opposing directions.

The cores of the sensor can be constructed of high performance ferromagnetic material such as an amorphous ferromagnetic alloy available from Allied Metals or Vacuum Schmeltzer Gesellschaft, or a high nickel ferromagnetic alloy (sometimes identified as a PERMALLOY (trademark)) available from Magnetics Inc., Arnold Magnetics Inc. or Magnetic Metals Corp.

Referring to FIGS. 2 and 3, an alternative embodiment of the direct coupled fluxgate sensor is illustrated, the sensor 18 is constructed of a first closed loop core means 20 enclosed in a first circumferential winding 22 and a parallel second closed loop core means 24 enclosed in a second circumferential drive winding 26. These two core means and drive windings are enveloped in a closed loop casing 28. The casing 28 is wound throughout its circumference with a sense winding 30. The two windings 22 and 26 enter the casing at ports 32. Referring particularly to FIG. 3, the two core means 20 and 24 are constructed of ferromagnetic ribbons 34 and 36 respectively. The first and second drive windings 22 and 26 are toroidally and independently wound around the circumferences of the respective sleeves 38 and 40.

The advantage of this configuration is that the two closed loop cores 4 and 6 or 20 and 24 arranged in side-by-side orientation act as the modulating element of the fluxgate current sensor 2 or 18. The toroidal sense winding 14 or 30, wound around the circumference of the closed loop core casing 8 or 28 provides the toroidal sense winding for the overall closed loop. The advantage of the combination of the two cores 4 and 6 and the casing 8, or 20 and 24 and casing 28, is that it provides optimum sensitivity to toroidal fields and minimum crosstalk with poloidal fields. Furthermore, utilizing two independent closed loop cores 2 and 4, or 20 and 24, side by side, but driven in opposition, combines the advantages of both parallel-strip fluxgates and ring cores fluxgates. Apart from the foregoing, this construction of fluxgate current sensor 2 or 18 has two major advantages. The first is that it is considerably more sensitive than prior known devices. The second is that as its size is increased, the performance of the fluxgate current sensor 2 or 18 actually and advantageously improves. This unexpected characteristic is in direct contrast to existing known devices where a deterioration in performance is expected with size increase.

A slight potential disadvantage of the novel construction of fluxgate current sensor 2 or 18 is that it does not adapt itself easily to clip around a wire, without introducing significant crosstalk with poloidal fields. However, this minor potential disadvantage is not pertinent for the uses contemplated for the fluxgate current sensor 2 or 28, such as oceanographic telluric measurements, oceanographic water velocity measurements, oceanographic mass-transport measurements, ionospheric telluric measurements, partical-beam intensity measurements, and maritime ship-speed measurements.

Figure 4A:
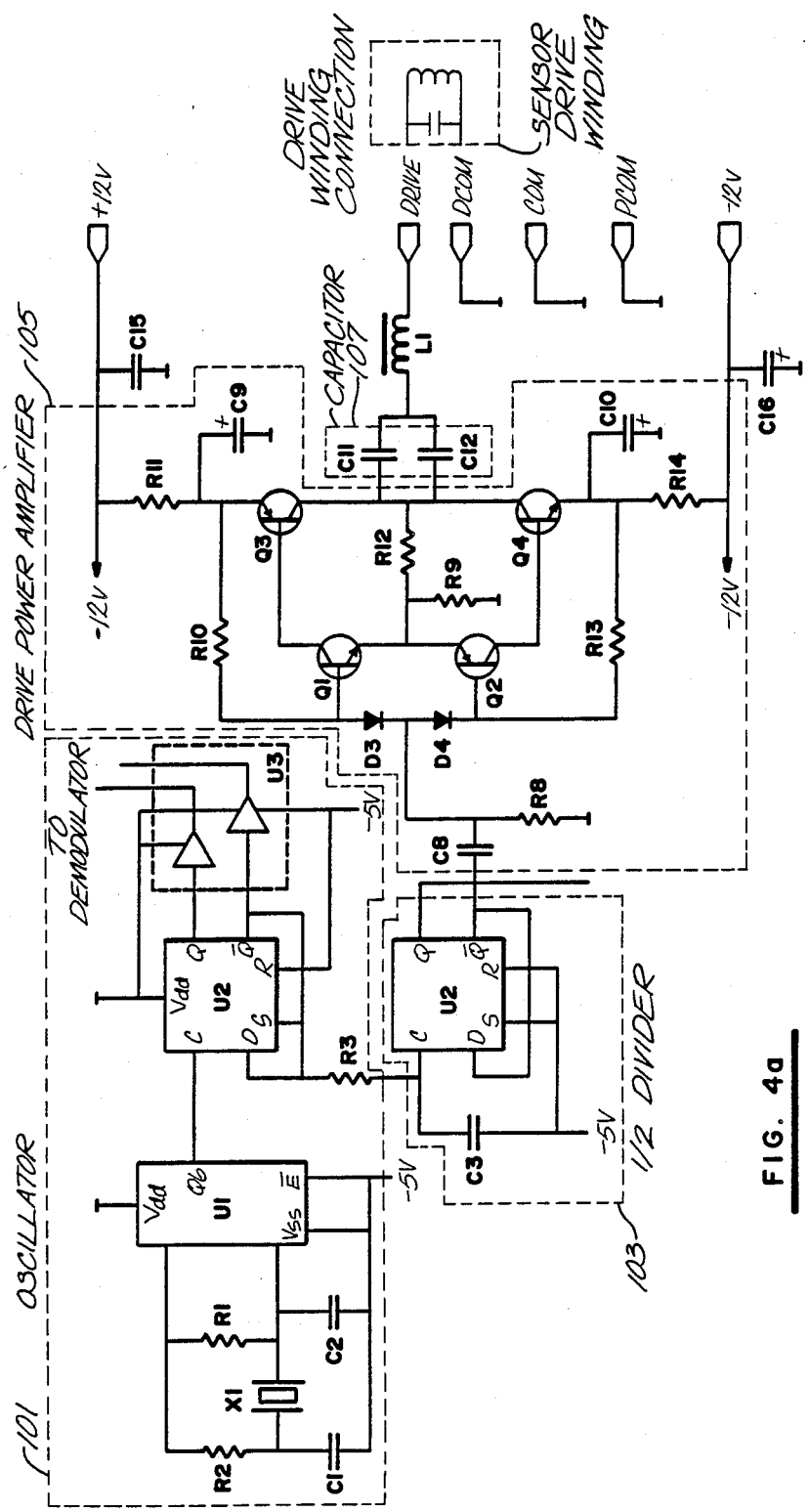
FIGS. 4a and 4b illustrate diagrams of circuits which can be used to power the fluxgate current sensor.
Figure 4B:
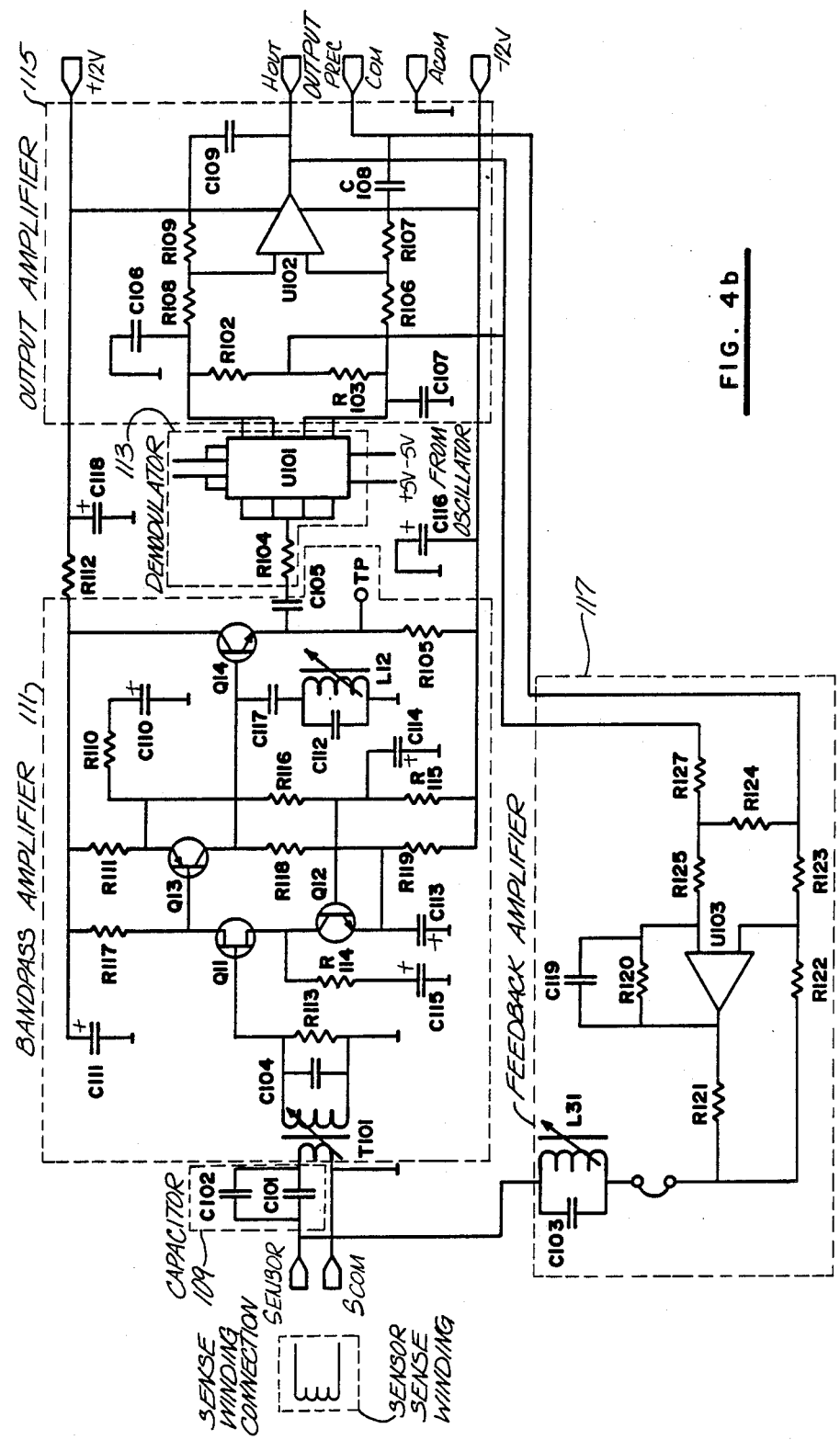

FIGS. 4a and 4b depict circuits which can be used to operate the direct-coupled sensor. The driving circuit (FIGS. 4a) is driven by directing an alternating current source through an oscillator 101 and subsequently through a ½ divider 103 to produce a square wave of a given frequency. The current is then amplified by a small drive power amplifier 105 and passed through a capacitor linkage 107 before being directed to the capacitor coupled driven winding around the first and second closed loop cores. The combination of the amplifier and the capacitor achieves hard core magnetic saturation levels which ensures that the sensor has high sensitivity levels.

FIGS. 4b depicts an amplifier circuit. The response in the sense winding around the core casing means is directed through a capacitor 109, then through a band pass amplifier 111, then through a demodulator 113, and finally through a current amplifier 115 before reaching the output. A feed back circuit 117 with a resistor or a transconductance amplifier links the output and the sense winding. There is also a link between the double frequency square wave current (FIG. 4a) from the oscillator of the drive circuit to the demodulator of the sense circuit.

Figure 6:
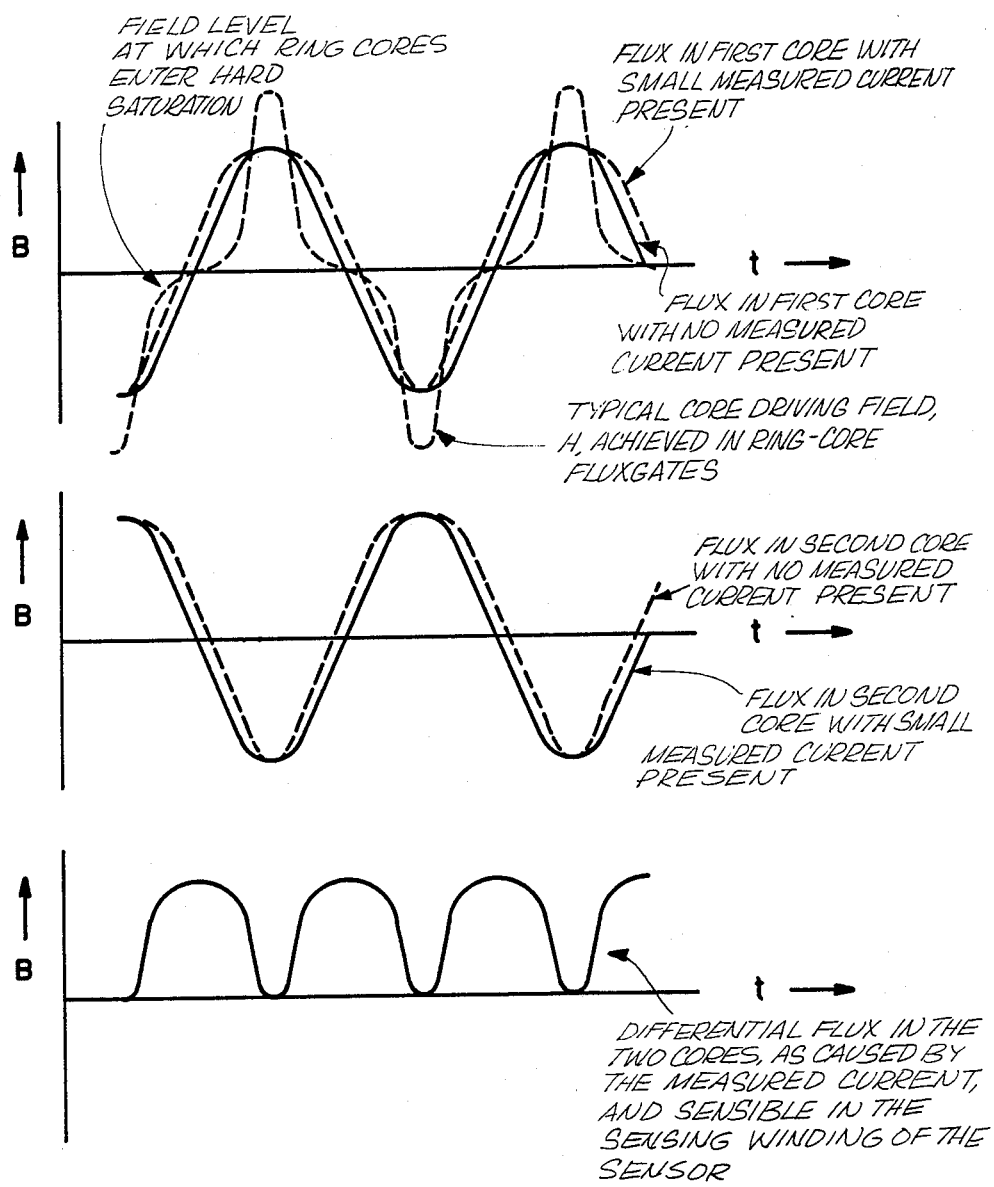
FIG. 6 depicts graphically a flux cycle achieved by the fluxgate current sensor.

FIG. 6 is a representation of the corresponding flux cycle achieved in the ringcore current sensor. Since fluxgates are normally used to measure very small fields, the drawing reflects this case. The flux-imbalance curve in FIG. 6 will vary in amplitude linearly as a function of measured current, as opposed to varying its timing. This is an important attribute of hard-saturation fluxgates.

Figure 5:
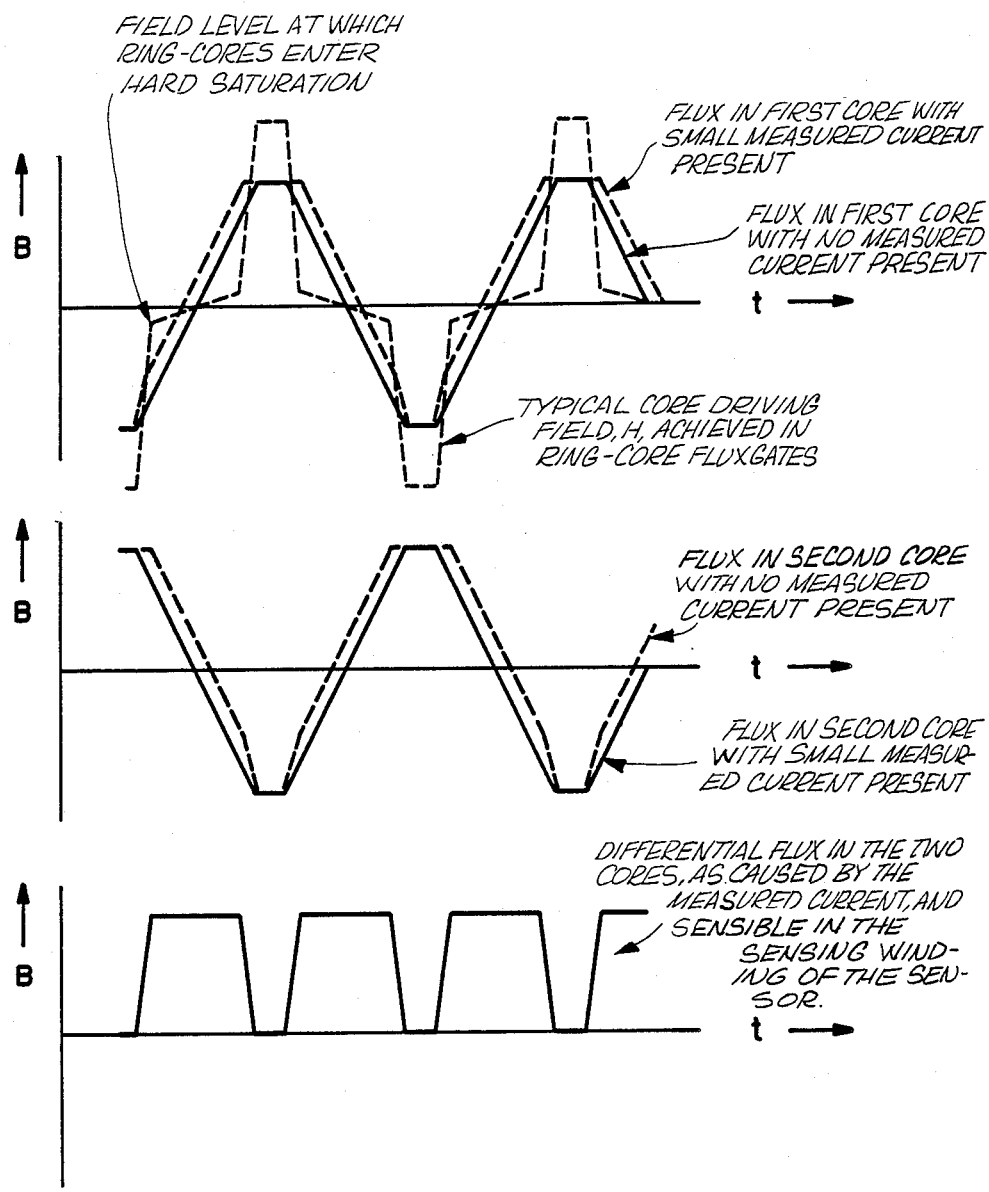
FIG. 5 depicts graphically an idealization of the curves depicted in FIG. 6.

FIG. 5 is an idealization of the curves shown in FIG. 6 and is presented to explain the operation of a typical hard-saturation fluxgate. The top solid curve represents the first fluxing core with no measured field present. The middle solid curve represents the second fluxing core. The bottom solid curve represents the sum of the differential. In such a fluxgate there is negligible flux imbalance between the two cores, during the period of hard saturation. By far, the dominant form of flux imbalance is present when the cores are not saturated. A fluxgate should be operated so that the transitions between the saturated and unsaturated state happen as quickly as possible, and at well-determined times which are independent of the imbalancing field. In this way, the sensor is operated so that the amplitude of the even harmonics of the differential flux is proportional to the measured field. Another feature is that the linearity of the fluxgate sensor is not a function of the magnetic properties of the core material.

EXAMPLE

A prototype of the direct coupled fluxgate current sensor 2 as illustrated in FIG. 1 has been constructed. It has a nominal diameter of 10 cm and has been found to achieve a resolution of 0.5 microamperes of current, or 50 microamperes/square-meter in a band width of 1 Hz.

This sensor was tested by connecting it to magnetometer electronics, similar to that described in NASA Technical Memorandum 79656, FIG. 7. The output was monitored with a high quality digital spectrum analyser.

A square-wave current of known amplitude and frequency of 1 Hz was passed through the sensor aperture to calibrate the sensor and electronics and to demonstrate its capability as a direct-coupled sensor. The sensor and electronics were then demonstrated to have the above-given resolution. The experiment was performed without any electromagnetic protection being provided for the sensor.

It will be understood that the ring cores of ferromagnetic material used in the device need not be toroidal in the true geometric sense of the word. These cores would function equally well if they were in the shape of any closed loop, (triangular, rectangular, or irregular) with any cross sectional shape (rectangular, circular or otherwise).

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

I claim:

1. A direct-coupled fluxgate current sensor which is driven by alternating electrical current to hard saturation to achieve a sudden change in magnetic properties of the sensor, comprising:
   (a) a first closed loop core means comprising ferromagnetic material susceptible to hard saturation encased in a sleeve wound with a first toroidal drive winding, the winding for the first core means extending around the circumference of the first core means;
   (b) a second closed loop core means comprising ferromagnetic material susceptible to hard saturation encased in a sleeve wound with a second toroidal drive winding independent of the first winding, the winding for the second core means extending around the circumference of the second core means; and,
   (c) a closed loop core casing means which is adapted to cooperate with the first core means and the second core means, for holding them in parallel side-by-side relationship, the closed loop core casing means and the first and second core means being wound as a unit with toroidal sense winding independent of the first and second toroidal drive windings, the winding for the closed loop core casing means extending around the circumference of the closed loop core casing means.

2. A method of sensing toroidal magnetic fields utilizing a single direct-coupled fluxgate current sensor which is driven by alternating electrical current to hard saturation to achieve a sudden change in magnetic properties of the sensor, wherein two closed loop cores with windings around their respective circumferences are used as the modulating element of the fluxgate, and the two closed loop cores cooperate with an independent closed loop core casing shaped in the form of a toroid, the closed lop core casing having a toroidal sense winding extending completely around the exterior of the casing, characterized by utilizing the two closed loop windings and cores to modulate the inductance of the toroidal sense winding by hard magnetically saturating the two closed loop cores on every alternating electrical current cycle so that there is no magnetic record in the two cores from any previous magnetization cycle.

3. A direct-coupled fluxgate current sensor which is driven by alternating electrical current to hard saturation to achieve a sudden change in magnetic properties of the sensor, comprising:
   (a) a first closed loop core means comprising ferromagnetic ribbon susceptible to hard saturation encased in a sleeve wound with a first toroidal drive winding, the winding for the first core means extending around the circumference of the first core means;
   (b) a second closed loop core means comprising ferromagnetic ribbon susceptible to hard saturation encased in a sleeve wound with a second toroidal drive winding independent of the first drive winding, the winding for the second core means extending around the circumference of the second core means;
   (c) a closed loop core casing means which is adapted to cooperate with the first core means and the second core means, for holding them in parallel side-by-side relationship, the closed loop core casing means and the first and second core means being wound as a unit with a toroidal sense winding independent of the first and second toroidal drive windings, the winding for the closed loop core casing means extending around the circumference of the closed loop core casing means; and
   (d) electronic circuit means responsive to application of alternating electrical current for driving the sensor to hard saturation to operate the direct-coupled sensor.

4. A direct-coupled fluxgate current sensor which is driven by alternating electrical current to hard saturation to achieve a sudden change in magnetic properties of the sensor, comprising:
   (a) a first closed loop core means comprising ferromagnetic ribbon susceptible to hard saturation encased in a sleeve wound with a first toroidal drive winding, the winding for the first core means extending around the circumference of the first core means;
   (b) a second closed loop core means comprising ferromagnetic ribbon susceptible to hard saturation encased in a sleeve wound with a second toroidal drive winding independent of the first winding, the winding for the second core means extending around the circumference of the second core means;
   (c) a closed loop core casing means which is adapted to cooperate with the first core means and the second core means, for holding them in parallel side-by-side relationship, the closed loop core casing means and the first and second core means being wound as a unit with a toroidal sense winding independent of the first and second toroidal drive windings, the winding for the closed loop core casing means extending around the circumference of the closed loop core casing means; and
   (d) circuit means for feeding back to the toroidal sense winding an analog of a signal measured by the sensor to maintain small signal levels in the sensor.

5. A method of sensing toroidal magnetic fields utilizing a single direct-coupled fluxgate current sensor and driving the current sensor by alternating electrical current to hard saturation to achieve a sudden change in magnetic properties of the sensor, wherein two closed loop cores with windings around their respective circumferences are used as the modulating element of the fluxgate and the two closed loop cores cooperate with an independent closed loop core casing shaped in the form of a toroid, the closed loop core casing having a toroidal sense winding extending completely around the exterior of the casing, characterized by utilizing current feedback to the sense winding of an analog of the measured signal to maintain small signal levels in the sensor.

6. A direct coupled fluxgate current sensor which is driven by alternating electrical current to hard saturation to achieve a sudden change in magnetic properties of the sensor, comprising:
(a) a first closed loop core means comprising ferromagnetic material susceptible to hard saturation wound with a first toroidal drive winding, the winding for the first core means extending around the circumference of the first core means;
(b) a second closed loop core means comprising ferromagnetic material susceptible to hard saturation wound with a second toroidal driven winding independent of the first winding, the winding for the second core means extending around the circumference of the second core means;
(c) a closed loop core casing means adapted to cooperate with the first core means and the second core means for holding them in side-by-side relationship, the closed loop core casing means and the first and second core means being wound as a unit with a toroidal sense winding independent of the first and second toroidal drive windings, the winding for the closed loop core casing means extending around the circumference of the closed loop core casing means;
(d) means electrically connected to the first and second toroidal drive windings for driving them with alternating current so as to suddenly change the ferromagnetic material between hard magnetic saturation and unsaturation; and,
(e) wherein the hard magnetic saturation of the ferromagnetic materials of the first and second cores are opposite.

7. A fluxgate current sensor as defined in claim 1 wherein the closed loop core casing means has an "H-shaped" cross section.

8. A fluxgate current sensor as defined in claim 7 wherein the first and second core means have rectangular cross sectional areas, and are adapted to be received in the openings of the "H-shaped" cross section shaped core casing means.

9. A fluxgate current sensor as defined in claim 1 wherein the first and second core means are ferromagnetic ribbons.

10. A method as defined in claim 2 wherein the two closed loop cores are arranged side by side.

11. A method as defined in claim 2 or 10 wherein the two closed loop cores are driven in opposition to one another.

12. A fluxgate current sensor as defined in claim 1, 3 or 4 wherein the core means is amorphous ferromagnetic alloy or high nickel ferromagnetic alloy.

13. A fluxgate current sensor as defined in claim 1 including a driving circuit which is driven by directing an alternating current source through an oscillator, subsequently through a one-half divider to produce a square wave of a given frequency, and amplifying the current and passing the current through a capacitor linkage before directing the current to a capacitor coupled to the direct drive toroidal sense winding around the first and second closed loop cores.

14. A fluxgate current sensor as defined in claim 1 including a feedback circuit which includes one of a resistor and a transconducting amplifier for linking current output and the sense winding.

15. A fluxgate current sensor as defined in claim 1, 13 or 14 including an amplifier circuit wherein a response in the sense winding around the core casing is directed through a capacitor, through a band pass amplifier, through a demodulator and lastly through an amplifier before being directed to an output.

16. A method as defined in claim 2 including feeding back to the sense winding an analog of the measured signal to maintain small signal levels in the sensor.

17. A method as defined in claim 2 wherein the alternating current used to drive the sensor to hard saturation creates a magnetic field level of the two closed loop cores which exceeds a field level necessary to achieve hard magnetic saturation of the two closed loop cores by about one hundred times.

18. A method as defined in claim 16 wherein field levels of toroidal magnetic field to be sensed by the sensor are about one thousand times small than a field level necessary to achieve hard saturation of the two closed loop cores.

19. A fluxgate current sensor as defined in claim 13 including a feedback circuit which includes one of a resistor and a transconducting amplifier for linking current output and the sense winding.

* * * * *

UNITED STATES PATENT AND TRADEMARK OFFICE
CERTIFICATE OF CORRECTION

PATENT NO. : 4,914,381
DATED : April 3, 1990
INVENTOR(S) : Barry Narod

It is certified that error appears in the above-identified patent and that said Letters Patent is hereby corrected as shown below:

On the title page:

Assignee, change "Barrigar & Oyen, Vancouver, Canada" to -- The University of British Columbia, Vancouver, Canada --.

Abstract, line 11, after "and" delete the comma.

Column 1, line 27, change "reference" to -- references --.
Column 1, line 34, change "2,760,158" to -- 2,760,158 --.
Column 1, line 41, change "Punnet" to -- Punnett --.
Column 1, line 42, change "Punnet's" to -- Punnett's --.
Column 1, line 57, after "which" change "has" to -- have --.

Column 2, lines 6,7, change "Punnet" to -- Punnett --.
Column 2, lines 7,8, change "the technique of hard saturating his cores." to -- hard saturation of cores. --.
Column 2, line 8, after "page 6," insert -- lines 24 to 28, where he discusses the problem of the --.
Column 2, line 13, change "metal" to -- meter --.
Column 2, lines 49,50, change "D'Angelo et al. Operates" to -- D'Angelo et al. operates --.
Column 2, line 58, change "directcoupled" to -- direct-coupled --.
Column 2, line 66, change "ferro-magnetic" to -- ferromagnetic --.

UNITED STATES PATENT AND TRADEMARK OFFICE
CERTIFICATE OF CORRECTION

PATENT NO. : 4,914,381
DATED : April 3, 1990
INVENTOR(S) : Barry Narod

It is certified that error appears in the above-identified patent and that said Letters Patent is hereby corrected as shown below:

Column 3, line 35, after "which" change "is" to -- if --.

Column 4, line 34, change "nano-amperes" to
-- nanoamperes --.

Column 5, line 31, after "illustrated" delete the comma and insert a period.
Column 5, line 32, before "sensor" change "the" to
-- The --.
Column 5, line 33, after "circumferential" insert
-- drive --.
Column 5, line 36, after "means and" delete "drive".

Column 6, line 7, change "28" to -- 18 --.
Column 6, line 10, change "partical beam" to
-- particle beam --.
Column 6, line 18, after "small" delete "drive".
Column 6, line 20, change "driven" to -- drive --.
Column 6, line 30, change "feed back" to -- feedback --.
Column 6, line 37, change "ringcore" to -- ring-core --.
Column 6, line 56, change "state" to -- states --.

Column 7, lines 5,6, change "wa s" to -- was --.

In the Claims

Column 7, line 47, after "and" delete the comma.
Column 7, line 53 after "with" insert -- a --.
Column 7, line 67, change "lop" to -- loop --.

UNITED STATES PATENT AND TRADEMARK OFFICE
CERTIFICATE OF CORRECTION

PATENT NO. : 4,914,381

DATED : April 3, 1990

INVENTOR(S) : Barry Narod

It is certified that error appears in the above-identified patent and that said Letters Patent is hereby corrected as shown below:

Column 9, line 27, after "toroidal" change "driven" to -- drive --.

Column 9, line 45, after "and" delete the comma.

Column 10, line 46, change "small" to -- smaller --.

Signed and Sealed this

Thirty-first Day of December, 1991

Attest:

HARRY F. MANBECK, JR.

*Attesting Officer*   *Commissioner of Patents and Trademarks*